United States Patent [19]
Sano et al.

[11] Patent Number: 5,399,604
[45] Date of Patent: Mar. 21, 1995

[54] EPOXY GROUP-CONTAINING RESIN COMPOSITIONS

[75] Inventors: Kimiyasu Sano; Masayuki Endo; Atsufumi Shimada, all of Yokohama; Yasuaki Yokoyama, Yokkaichi; Nobuo Bessho, Yokohama, all of Japan

[73] Assignee: Japan Synthetic Rubber Co., Ltd., Tokyo, Japan

[21] Appl. No.: 94,436

[22] Filed: Jul. 21, 1993

[30] Foreign Application Priority Data

Jul. 24, 1992 [JP] Japan .................................. 4-198741
Nov. 25, 1992 [JP] Japan .................................. 4-315406

[51] Int. Cl.⁶ .......................... C08K 5/04; C08K 5/06; C08L 31/00; C08L 33/14
[52] U.S. Cl. .................... 524/356; 524/366; 524/378; 524/379; 524/755; 524/761; 524/765; 524/769; 524/770; 525/100; 526/329.1; 526/329.2; 526/329.6; 528/27; 522/114; 522/120; 522/129
[58] Field of Search ............. 526/328, 329.2, 329.1, 526/329.6, 329.7; 524/379, 381, 386, 388, 765, 769, 804, 811, 378, 377, 376, 366; 525/100, 105; 528/27

[56] References Cited

U.S. PATENT DOCUMENTS

| 2,604,463 | 7/1952 | Bilton et al. | 260/80.5 |
| 4,097,643 | 6/1978 | Hasegawa | 525/100 |
| 4,163,739 | 8/1979 | Dälibor | 524/379 |
| 4,678,835 | 7/1987 | Chang et al. | 525/100 |
| 4,818,790 | 4/1989 | Ooka et al. | 525/100 |
| 4,963,617 | 10/1990 | Fourquier et al. | 524/805 |
| 5,344,890 | 9/1994 | Miyazono et al. | 528/27 |

FOREIGN PATENT DOCUMENTS

0270428 6/1988 European Pat. Off. .
2442867 6/1980 France .

OTHER PUBLICATIONS

Chemical Abstracts, vol. 80, No. 6, Feb. 11, 1974, AN 28001b, Tsutomu Kagiya, et al., "Crosslinking of Epoxy Resins with Vinyl Monomers", p. 42.

*Primary Examiner*—Susan W. Berman
*Attorney, Agent, or Firm*—Oblon, Spivak, McClelland, Maier & Neustadt

[57] ABSTRACT

An epoxy group-containing thermosetting resin composition comprising (A) a copolymer obtained from (a) at least one member selected from an unsaturated carboxylic acid and an unsaturated carboxylic acid anhydride, (b) an epoxy group-containing unsaturated compound, (c) a monoolefin unsaturated compound, and optionally (d) a conjugated diolefin unsaturated compound, and (B) an organic solvent for dissolving the above copolymer. There is also provided another epoxy-group containing thermosetting resin composition which contains the above component (A), (C) a polymerizable compound having at least one ethylenically unsaturated double bond, and (D) a photopolymerization initiator. These epoxy-group containing thermosetting resin compositions are excellent in storage stability.

11 Claims, No Drawings

EPOXY GROUP-CONTAINING RESIN COMPOSITIONS

The present invention relates to an epoxy group-containing resin composition. More specifically, it relates to a one-pack type epoxy group-containing thermosetting resin composition excellent in storage stability, and a radiation-sensitive resin composition containing an epoxy group-containing resin which composition permits facile removal of an unnecessary portion with an alkaline developer after exposed.

Epoxy resin-based thermosetting resin compositions have been and are used for coating compositions, electric insulating materials, printed wiring boards, adhesives, civil construction materials, toolings, molding materials, sealing resins and protection films in a wide range of industries, since cured epoxy resin-based thermosetting resin compositions are excellent in heat resistance, mechanical properties, chemical resistance, adhesive properties, processability and optical properties.

Most of these conventional epoxy resin-based thermosetting resin compositions contain a special curing agent (a compound such as amine or carboxylic acid) in combination for the purpose of promoting the crosslinking reaction in heat treatment, since they can not be imparted with sufficient properties (heat resistance and hardness) when an epoxy resin alone is heat-treated. One-pack type compositions containing an epoxy resin and a curing agent are poor in storage stability, and two-pack type compositions are therefore mainly used. When two-pack type compositions are used, an epoxy resin and a curing agent are mixed just before use. Concerning the two-pack type compositions, however, the following problems remain to solve. The procedure of mixing an epoxy resin with a curing agent is troublesome, it is difficult to adjust the mixing ratio properly, and the composition is poor in storage stability after the mixing of the two components.

For overcoming the above problems, a one-pack type thermosetting resin composition containing a modified epoxy compound whose epoxy group has been modified by a chemical reaction is being studied for development. However, problems still remain to solve concerning setting of modification reaction conditions for controlling by-products, and purification and quantification of a reaction product for removing by-products.

On the other hand, radiation-sensitive compositions containing an alkali-soluble resin such as a novolak resin permit the removal of an unnecessary portion in an exposure/development process, and they are therefore widely used as materials for a bump-forming resist, a printed circuit-forming resist, an interlayer insulating film and a circuit protection film in producing a printed circuit board or mounting a semiconductor device and an electronic part on a printed circuit board; and as materials for a color filter protection film and a colored resist for a color filter.

The defect with most of the above radiation-sensitive resin compositions containing an alkali-soluble resin such as a novolak resin is that patterns produced therefrom are inferior in physical properties such as heat resistance and solvent resistance since these compositions have no crosslinking component.

For overcoming the above defect, it has been strongly desired to develop a material having the properties of both an epoxy resin composition and an alkali-soluble resin, i.e., a resin composition which has both thermosetting properties (heat resistance) and photosensitivity, and studies for the development are variously under way.

For example, an attempt is made to produce a material having the properties of both radiation sensitivity and heat resistance by modifying part of epoxy group of an epoxy oligomer with acrylic acid to produce an epoxy acrylate having an epoxy group and a double bond and combining the epoxy acrylate with a photopolymerization initiator. However, when the above epoxy acrylate is used as a base polymer, there is a problem in terms of quality control that the modification ratio in the modification reaction and the modification reaction are complicated and that the quantification of the modification ratio is difficult.

When a resin having an epoxy group and an alkali-soluble resin are mixed, the compatibility of these two resins in the mixed resin solution and the storage stability of the mixed resin solution remain to solve.

Further, studies on the development of materials having heat resistance and photosensitivity such as photosensitive polyimide are also under way. However, there is a defect in that the solvent is limited to polar solvents since polyimide is used.

When polyamic acid which is a precursor of polyimde is used, the baking temperature for imidation to impart heat resistance is required to be 250° C. or higher, and it causes a problem of heat resistance (destruction) of various devices on a substrate during the process. Further, there is a defect in that the resultant coating is poor in hygroscopicity and transparency.

It is an object of the present invention to provide a novel epoxy group-containing resin composition.

It is another object of the present invention to provide a novel epoxy group-containing resin composition which undergoes facile curing under heat without any special curing agent, and gives a cured product excellent in heat resistance, mechanical properties, chemical resistance, adhesion, processability and optical properties.

It is further another object of the present invention to provide an epoxy group-containing thermosetting resin composition which has excellent storage stability as a one-pack type composition without impairing the excellent properties of conventional epoxy resin compositions.

It is still further another object of the present invention to provide an epoxy group-containing radiation-sensitive resin composition which permits facile removal of an unnecessary portion with an alkali developer solution after exposure.

It is yet another object of the present invention to provide an epoxy group-containing thermosetting resin composition suitable as a material for a coating composition, an electrical insulating material, a printed circuit board, an adhesive, a civil construction material, toolings, a molding material and a protection film.

Further, it is another object of the present invention to provide an epoxy group-containing radiation-sensitive resin composition suitable as a material for a bump-forming resist, a circuit-forming resist, an electric plating resist, an electroless plating resist, a solder resist, an etching resist, an interlayer insulating film, a gate insulating film, a capacitor insulating film, a passivation film, an α-ray shielding film, and a buffer coating film which are required for production of a printed circuit board or for mounting semiconductors and electronic parts on a printed circuit board; and as a material for a color filter protection film for LCD, CCD and a spacer fir touch panel whose optical properties are considered to be critical, a colored resist for a color filter and a surface protection film for an optical disk.

Other objects and advantages of the present invention will be apparent from the following description.

According to the present invention, the above objects and advantages of the present invention are achieved by either of the following four compositions:

An epoxy group-containing thermosetting resin composition (to be referred to as "first thermosetting resin composition" hereinafter) comprising;
(A) a copolymer (to be referred to as "first copolymer" hereinafter) obtained from the following unsaturated monomers (a), (b) and (c);
  (a) at least one member selected from an unsaturated carboxylic acid and an unsaturated carboxylic acid anhydride,
  (b) an epoxy group-containing unsaturated compound, and
  (c) a monoolefin unsaturated compound, and
(B) an organic solvent for dissolving the above copolymer.

An epoxy group-containing thermosetting resin composition (to be referred to as "second thermosetting resin composition" hereinafter) comprising;
(A)' a copolymer (to be referred to as "second copolymer" hereinafter) obtained from the following unsaturated monomers (a), (b), (c) and (d);
  (a) at least one member selected from an unsaturated carboxylic acid and an unsaturated carboxylic acid anhydride,
  (b) an epoxy group-containing unsaturated compound,
  (c) a monoolefin unsaturated compound, and
  (d) a conjugated diolefin unsaturated compound, and
(B) an organic solvent for dissolving the above copolymer.

An epoxy group-containing radiation-sensitive resin composition (to be referred to as "first radiation-sensitive composition") comprising:
(A) the above first copolymer,
(C) a polymerizable compound having at least one ethylenically unsaturated double bond, and
(D) a photopolymerization initiator.

An epoxy group-containing radiation-sensitive resin composition (to be referred to as "second radiation-sensitive composition" hereinafter) comprising:
(A)' the above second copolymer,
(C) a polymerizable compound having at least one ethylenically unsaturated double bond, and
(D) a photopolymerization initiator.

The compositions of the present invention have a principal characteristic feature in the use of a copolymer whose molecule has either a carboxylic acid group or a carboxylic acid anhydride group and an epoxy group. This copolymer has solubility in an alkali, and it has excellent storage stability and undergoes facile curing under heat without using any special curing agent. The compositions of the present invention give cured products excellent in heat resistance, mechanical properties, chemical resistance and optical properties.

The compositions of the present invention will be detailed hereinafter.

First Copolymer

The first copolymer used in the present invention is a copolymer obtained from;
(a) at least one member selected from an unsaturated carboxylic acid and an unsaturated carboxylic acid anhydride,
(b) an epoxy group-containing unsaturated compound, and
(c) a monoolefin unsaturated compound.

The unsaturated carboxylic acid and the unsaturated carboxylic acid anhydride are preferably selected from aliphatic mono- and dicarboxylic acids having 3 to 5 carbon atoms, acid anhydrides thereof and half esters of aliphatic dicarboxylic acids.

As the unsaturated carboxylic acid and the unsaturated carboxylic acid anhydride, more preferred are compounds of the formulae (1) and (2):

wherein each of $R^1$ and $R^2$ is independently a hydrogen atom or a lower alkyl group having 1 to 6 carbon atoms.

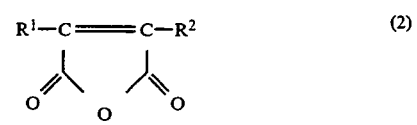

wherein $R^1$ and $R^2$ are as defined above.

Examples of the unsaturated carboxylic acid and the unsaturated carboxylic acid anhydride preferably include unsaturated monocarboxylic acids such as acrylic acid, methacrylic acid and crotonic acid; unsaturated dicarboxylic acids such as maleic acid, fumaric acid, citraconic acid, mesaconic acid and itaconic acid; unsaturated carboxylic acid anhydrides such as maleic anhydride and itaconic anhydride; and unsaturated dicarboxylic acid monoalkyl esters such as monomethyl fumarate, monobutyl fumarate, monomethyl maleate, monoethyl maleate, monobutyl maleate, monomethyl itaconate, monoethyl itaconate and monobutyl itaconate.

The above unsaturated carboxylic acid and unsaturated carboxylic acid anhydrides may be used alone or in combination.

The epoxy group-containing unsaturated compound (b) is preferably an epoxyalkyl ester of acrylic acid or α-alkylacrylic acid, and N-epoxyalkyl acrylamide or α-alkylacrylamide.

The epoxy group-containing unsaturated compound (b) is more preferably a compound of the formula (3),

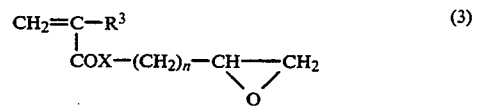

wherein $R^3$ is a hydrogen atom or a lower alkyl group having 1 to 4 carbon atoms, n is an integer of 1 to 10, and X is —O— or a group of the formula

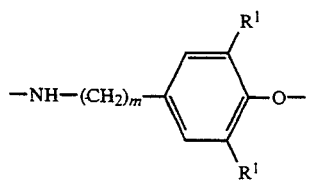

wherein $R^1$ is as defined above and m is an integer of 1 to 10.

Examples of the epoxy group-containing unsaturated compound include glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, N-(4-(2,3-epoxypropoxy)-3,5-dimethylbenzyl)acrylamide and N-(4-(2,3-epoxypropoxy)-3,5-dimethylphenylpropyl)acrylamide.

The above epoxy group-containing unsaturated compounds may be used alone or in combination.

The monoolefin unsaturated compound (c) is selected from radical-polymerizable monoolefins other than the above compounds (a) and (b). The monoolefin unsaturated compound (c) preferably includes alkyl ester, hydroxyalkyl ester, cycloalkyl ester or aryl ester of aliphatic unsaturated monocarboxylic acid, dialkyl ester of aliphatic unsaturated dicarboxylic acid, and other vinyl compound.

The monoolefin unsaturated compound (c) is more preferably selected from compounds of the formulae (4) and (5):

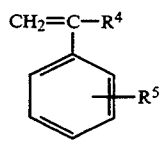
(4)

wherein $R^4$ is a hydrogen atom or a lower alkyl group having 1 to 4 carbon atoms, and $R^5$ is a hydrogen atom, a lower alkyl group having 1 to 4 carbon atoms or a lower alkoxy group having 1 to 4 carbon atoms.

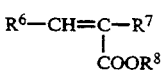
(5)

wherein each of $R^6$ and $R^7$ is independently a hydrogen atom or methyl group, and $R^8$ is an alkyl group having 1 to 6 carbon atoms or a cycloalkyl group having 5 to 12 carbon atoms provided that the cycloalkyl group is optionally substituted.

Examples of the monoolefin unsaturated compound (c) include alkyl methacrylates such as methyl methacrylate, ethyl methacrylate, n-butyl methacrylate, sec-butyl methacrylate and tert-butyl methacrylate; alkyl acrylates such as methyl acrylate and isopropyl acrylate; cycloalkyl methacrylates such as cyclohexyl methacrylate, 2-methylcyclohexyl methacrylate, dicyclopentanyl methacrylate, dicyclopentanyloxyethyl methacrylate and isobornyl methacrylate; cycloalkyl acrylates such as cyclohexyl acrylate, 2-methylcyclohexyl acrylate, dicyclopentanyl acrylate, dicyclopentanyloxyethyl acrylate and isobornyl acrylate; aryl methacrylates such as phenyl methacrylate and benzyl methacrylate; aryl acrylates such as phenyl acrylate and benzyl acrylate; dicarboxylic acid diesters such as diethyl meleate, diethyl fumarate and diethyl itaconate; hydroxyalkyl esters such as 2-hydroxyethyl methacrylate and 2-hydroxypropyl methacrylate; styrene, α-methylstyrene, m-methylstyrene, p-methylstyrene, vinyltoluene, p-methoxystyrene and p-tert-butoxystyrene.

The above compounds may be used alone or in combination.

The first copolymer (A) is composed of structural units derived from the above unsaturated monomers. Above all, preferred are structural units of the formulae (1)-a, (2)-a, (3)-a, (4)-a and (5)-a.

(1)-a wherein $R^1$ and $R^2$ are as defined in the formula (1).

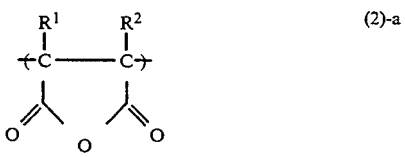
(2)-a wherein $R^1$ and $R^2$ are as defined in the formula (2).

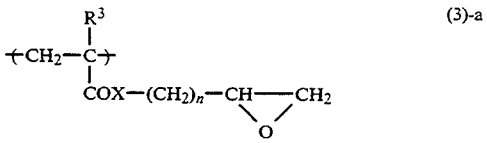
(3)-a wherein $R^3$, X and n are as defined in the formula (3).

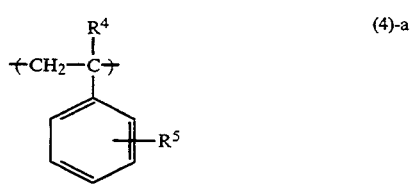
(4)-a wherein $R^4$ and $R^5$ are as defined in the formula (4).

(5)-a wherein $R^6$, $R^7$ and $R^8$ are as defined in the formula (5).

Second Copolymer (A)'

The second copolymer (A)' used in the present invention is a copolymer obtained from compounds (a), (b) and (c) which are the same as the compounds (a), (b) and (c) described regarding the first copolymer (A) and a conjugated diolefin unsaturated compound (d).

As the conjugated diolefin compounds, for example, preferred is a compound of the formula (6),

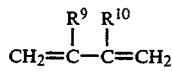
(6)

wherein each of $R^9$ and $R^{10}$ is independently a hydrogen atom, a methyl group or an optionally substituted phenyl group.

Examples of the conjugated diene unsaturated compound (6) include 1,3-butadiene, isoprene and 2,3-dimethylbutadiene.

It should be understood that the descriptions concerning the compounds (a), (b) and (c) for the first copolymer (A) can be applied to the compounds (a), (b) and (c) for the second copolymer (A)'.

The second copolymer (A)' is composed of structural units derived from the above unsaturated monomers. Preferred are the structural units of the already described formulae (1)-a, (2)-a, (3)-a, (4)-a and (5)-a and the structural unit of the formula (6)-a:

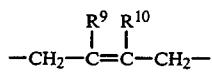
(6)-a wherein $R^9$ and $R^{10}$ are as defined in the formula (6).

The second copolymer is preferably composed of the structural units of the formulae (1), (3), (4), (5) and (6) or the structural units of the formulae (2), (3), (4), (5) and (6).

The copolymer (A) or (A)' used in the present invention contains preferably 5 to 40% by weight, more preferably 10 to 30% by weight, of structural units derived from at least one of the above unsaturated carboxylic acid and unsaturated carboxylic acid anhydride (a).

The copolymer (A) or (A)' used in the present invention contains preferably 10 to 70% by weight, more preferably 20 to 60% by weight, of structural units derived from the above epoxy group-containing unsaturated compound (b).

The copolymer (A) or (A)' used in the present invention contains preferably 10 to 70% by weight, more preferably 20 to 60% by weight, of structural units derived from the above monoolefin compound (c).

The copolymer (A)' used in the present invention contains preferably 0.1 to 30% by weight, more preferably 1 to 15% by weight, of structural units derived from the above conjugated diolefin compound (d).

As described above, the copolymer (A) used in the present invention is obtained by copolymerizing at least one of the above unsaturated carboxylic acid and unsaturated carboxylic acid anhydride (a), the above epoxy group-containing unsaturated compound (b) and the above monoolefin unsaturated compound (c). The copolymer (A)' used in the present invention is obtained by copolymerizing at least one of the above unsaturated carboxylic acid and unsaturated carboxylic acid anhydride (a), the above epoxy group-containing unsaturated compound (b), the above monoolefin unsaturated compound (c) and the above conjugated diolefin unsaturated compound (d). Therefore, the gelation of the polymerization system in the polymerization can be prevented, and the copolymer (A) and the copolymer (A)' are excellent in storage stability.

Meanwhile, in producing a base polymer only from either the unsaturated carboxylic acid or unsaturated carboxylic acid anhydride (a) and the epoxy group-containing unsaturated compound (b), the epoxy group and the carboxylic acid group are liable to react with each other and crosslink to cause gelation of the reaction system.

The thermosetting resin composition and the radiation-sensitive resin composition which contain the above copolymer (A) or (A)' can form a cured film excellent in heat resistance.

When the amount of the structural units derived from the epoxy group-containing unsaturated compound (b) is less than 10% by weight or when the amount of the structural units derived from the monoolefin unsaturated compound (c) is more than 70% by weight, the heat resistance of a cured film obtained from the thermosetting resin composition or the radiation-sensitive resin composition containing the copolymer (A) or (A)' is sometimes insufficient.

The thermosetting resin composition and the radiation-sensitive resin composition which contain the copolymer (A)' containing structural units derived from the conjugated diolefin unsaturated compound (d) in the above amount range can highly flatten a height difference of a substrate and can highly improve the sensitivity to radiation.

When the copolymer (A)' contains more than 30% by weight of structural units derived from the conjugated diolefin unsaturated compound (d), the heat resistance of a cured film obtained from the thermosetting resin composition or the radiation-sensitive resin composition containing the copolymer (A)' is sometimes insufficient.

The above copolymers (A) and (A)' are soluble in an alkaline aqueous solution.

The above copolymers (A) and (A)' require no modification step, and these copolymers can be produced by a copolymerization step alone. The copolymer (A) can be obtained by radical-polymerizing at least one of the above unsaturated carboxylic acid and unsaturated carboxylic acid anhydride (a), the above epoxy group-containing unsaturated compound (b) and the above monoolefin unsaturated compound (c), and the copolymer (A)' can be obtained by radical-polymerizing at least one of the above unsaturated carboxylic acid and unsaturated carboxylic acid anhydride (a), the above epoxy group-containing unsaturated compound (b), the above monoolefin unsaturated compound (c) and the above conjugated diolefin unsaturated compound (d), in a solvent in the presence of a catalyst (polymerization initiator).

The above solvent is selected from alcohols such as methanol and ethanol; ethers such as tetrahydrofuran; cellosolve esters such as methyl cellosolve acetate; other aromatic hydrocarbons; ketones; and esters.

The catalyst for the radical polymerization is selected from usual radical polymerization initiators. Examples of the catalyst include azo compounds such as 2,2'-azobisisobutyronitrile, 2,2'-azobis(2,4-dimethylvaleronitrile) and 2,2'-azobis(4-methoxy-2,4-dimethylvaleronitrile); organic peroxides such as benzoyl peroxide, lauroyl peroxide, tert-butylperoxypivalate and 1,1'-bis-(tert-butylperoxy)cyclohexane; and hydrogen peroxide. When a peroxide is used as a radical polymerization initiator, a combination of the peroxide with a reducing agent may be used as a redox initiator.

The above copolymers (A) and (A)' are not specially limited in molecular weight and molecular distribution as far as solutions of the compositions of the present invention can be uniformly applied.

[B] Organic Solvent

The organic solvent used in the present invention serves to form a solution of the above copolymer (A) or (A)', and is selected from those which are compatible and unreactive with the copolymers (A) or (A)'. The organic solvent includes alcohols such as methanol and ethanol, ethers such as dichloroethyl ether, n-butyl ether, diisoamyl ether, methylphenyl ether and tetrahydrofuran; glycol ethers such as ethylene glycol monomethyl ether and ethylene glycol monoethyl ether; cellosolve acetates such as methyl cellosolve acetate, ethyl cellosolve acetate and diethyl cellosolve acetate; carbitols such as methyl ethyl carbitol, diethyl carbitol, diethylene glycol monomethyl ether, diethylene glycol monoethyl ether, diethylene glycol dimethyl ether, diethylene glycol methylethyl ether and diethylene glycol diethyl ether; propylene glycol alkyl ether acetates such as propylene glycol methyl ether acetate and propylene glycol propyl ether acetate; aromatic hydrocarbons such as toluene and xylene; ketones such as methyl ethyl ketone, cyclohexanone, 4-hydroxy-4-methyl-2-pentanone, methyl-n-propylketone, methyl-n-butylketone, methyl-n-amylketone and 2-heptanone; saturated aliphatic monocarboxylic acid alkyl esters such as ethyl acetate, n-butyl acetate and isobutyl acetate; lactates such as methyl lactate and ethyl lactate; alkyl oxyacetates such as methyl oxyacetate, ethyl oxyacetate and butyl oxyacetate; alkyl alkoxyacetates such as methyl methoxyacetate, ethyl methoxyacetate, butyl methoxyacetate, methylethoxyacetate and ethyl ethoxyacetate; alkyl 3-oxypropionates such as methyl 3-oxypropionate and ethyl 3-oxypropionate; alkyl 3-alkoxypropionates such as methyl 3-methoxyproplonate, ethyl 3-methoxypropionate, ethyl 3-ethoxypropionate and methyl 3-ethoxypropionate; alkyl 2-oxypropionates such as methyl 2-oxypropionate, ethyl 2-oxypropionate and propyl 2-oxypropionate; alkyl 2-alkoxypropionates such as methyl 2-methoxypropionate, ethyl 2-methoxypropionate, ethyl 2-ethoxyproplonate and methyl 2-ethoxypropionate; 2-oxy-2-methylpropionic acid esters such as methyl 2-oxy-2-methylpropionate and ethyl 2-oxy-2-methylpropionate; alkyl monooxymonocarboxylates of alkyl 2-alkoxy-2-methyl propionates such as methyl 2-methoxy-2-methylpropionate and ethyl 2-ethoxy-2-methylpropionate; esters such as ethyl 2-hydroxypropionate, ethyl 2-hydroxy-2-methylpropionate, ethyl hydroxyacetate and methyl 2-hydroxy-3-methylbutanoate; ketonic acid esters such as ethyl pyruvate; and high-boiling solvents such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, diethyleneglycol dimethylether, acetonylacetone, isophorone, caproic acid, caprilic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenylcellosolve acetate.

In view of compatibility and reactivity, preferred are glycol ethers such as ethylene glycol monoethyl ether; ethylene glycol alkyl ether acetates such as ethylcellosolve acetate; esters such as ethyl 2-hydroxypropionate; and diethylene glycols such as diethylene glycol monomethyl ether.

The first thermosetting resin composition of the present invention comprises the above first copolymer (A) and the above organic solvent (B). The second thermosetting resin composition of the present invention comprises the second copolymer (A)' and the organic solvent (B).

In these first and second thermosetting resin compositions, the amount of the copolymer (A) or (A)' based on the total amount of the corresponding composition is 1 to 70% by weight, more preferably 3 to 50% by weight.

[C] Polymerizable Compound

The polymerizable compound (C) having at least one ethylenically unsaturated double bond, used in the present invention, is preferably selected from monofunctional or polyfunctional esters of acrylic acid or methacrylic acids.

Examples of the monofunctional (meth)acrylates include commercially available products such as Aronix M-101, M-111 and M-114 (supplied by Toagosei Chemical Industry Co., Inc.), AKAYARAD TC-110S and TC-110S (supplied by Nippon Kayaku Co. Ltd), and V-158 and V-2311 (supplied by Osaka Organic Chemical Industry Ltd). Examples of the difunctional (meth)acrylates include commercially available products such as Aronix M-210, M-240 and M-6200 (supplied by Toagosei Chemical Industry Co., Inc.), KAYARAD HDDA, HX-220 and R-604(supplied by Nippon Kayaku Co., Ltd), V260, V313 and V335P (supplied by Osaka Organic Chemical Industry Ltd.) and Furuorenhydroxy acrylate (ASF-400 supplied by Nippon Steel Chemical Co., Ltd.). Examples of the trifunctional or higher (meth)acrylates include trimethylolpropane triacrylate, pentaerythritol triacrylate, trisacryloyloxyethyl phosphate, pentaerythritol tetraacrylate, dipentaerythritol pentaacrylate and dipentaerythritol hexaacrylate, and examples of their commercial products include Aronix M-309, M-400, M-405, M-450, M-7100, M-8030 and M-8060 (supplied by Toagosei Chemical Industry Co., Ltd.), KAYARAD TMPTA, DPCA-20, DPCA-30, DPCA-60 and DPCA-120 (supplied by Nippon Kayaku Co., Ltd.) and V-295, V-300, V-360, V-GPT, V-3PA and V-400 (supplied by Osaka Organic Chemical Industry, Ltd).

The above compounds may be used alone or in combination. The amount of the polymerizable compound (C) per 100 parts by weight of the copolymer (A) or (A)' is preferably 40 to 200 parts by weight, more preferably 50 to 150 parts by weight. When this amount is less than 40% by weight, the sensitivity in oxygen atmosphere is liable to deteriorate. When it exceeds 200 parts by weight, the compatibility with the copolymer (A) or (A)' is liable to deteriorate and a formed coating is liable to have a roughened surface.

(D) Photopolymerization Initiator

The photopolymerization initiator (D) used in the radiation-sensitive reson composition of the present invention is selected from photo radical polymerization initiators and photo cationic polymerization initiators.

In using the photopolymerization initiator, it is necessary to consider exposure conditions (whether the exposure is carried out in oxygen atmosphere or it is carried out in oxygen-free atmosphere). Specifically, when the exposure is carried out in oxygen-free atmosphere, the photopolymerization initiator can be selected from almost all of general photo radical polymerization initiators and photo cationic polymerization initiators.

Examples of the photo radical polymerization initiators include α-diketones such as benzyl and diacetyl; acyloins such as benzoin; acyloin ethers such as benzoin methyl ether, benzoin ethyl ether and benzoin isopropyl ether; benzophenones such as thioxanthone, 2,4-diethylthioxanthone, thioxanthone-4-sulfonic acid, benzophenone, 4,4'-bis(dimethylamino)benzophenone and 4,4'-bis(diethylamino)benzophenone; acetophenones such as acetophenone, p-dimethylaminoacetophenone, α, α'-dimethoxyacetoxybenzophenone, 2,2'-dimethoxy-2-phenylacetophenone, p-methoxyacetophenone, 2-methyl[4-(methylthlo)phenyl]-2-morpholino-1-propane and 2-benzyl-2-diemthylamino-1-(4-morpholinophenyl)-butan-1-one; quinones such as anthraquinone and 1,4-naphthoquinone; halogen compounds such as phenacyl chloride, tribromomethylphenylsulfone and tris(trichloromethyl)-s-triazine; peroxides such as di-tert-butyl peroxide; and acylphosphine oxides such as 2,4,6-trimethylbenzoyldiphenylphosphine oxide.

The photo cationic polymerization initiator can be selected from the following commercially available products such as Adeca Ultraset PP-33 (supplied by Asahi Denka Kogyo K. K.) which is diazonium salt, OPTOMER SP-150,170 (supplied by Asahi Denka Kogyo K. K.) which is sulfonium salt and IRGACURE 261 (supplied by Ciba Geigy) which is a metallocene compound.

When the exposure is carried out in oxygen atmosphere, some of the photo radical polymerization initiators undergo inactivation (decrease In sensitivity) due to oxygen, and a formed film is sometimes insufficient in a resin remaining ratio and hardness of an exposed portion. When the exposure is carried out in oxygen atmosphere, preferred are (a) all of the above photo cationic polymerization initiators (which are almost free from inactivation of active species by oxygen) and (2) some of the photo radical polymerization initiators, e.g., acetophenones such as 2-methyl-[4-(methylthio)-phenyl]-2-morpholino-1-propane and 2-benzyl-2-dimethylamino-1-(4-morpholinophenyl)-1-butan-1-one, halogen compounds such as phenacyl chloride, tribromomethylphenylsulfone and tris(trichloromethyl)-s-triazine, and acylphosphine oxides such as 2,4,6-trimethylbenzoyldiphenylphosphine oxide. The amount of the photopolymerization initiator per 100 parts by weight of the copolymer (A) or (A)' is preferably 1.0 to 50 parts by weight, more preferably 5 to 30 parts by weight. When this amount is less than 1% by weight, the inactivation of radical (decrease in sensitivity) is liable to occur due to oxygen. When it exceeds 50 parts by weight, the color density in the solution is sometimes high.

Further, the inactivation by oxygen can be decreased and the high sensitivity can be achieved, by using the photo radical polymerization initiator and either the photo cationic polymerization initiator or a photosensitizer in combination.

Other additives

Surfactant

The thermosetting resin composition and radiation-sensitive resin composition of the present invention may contain a surfactant. Examples of the surfactant include commercially available fluorine-containing surfactants such as BM-1000 and BM-1100 (supplied by BM Chemie), Megafac F142D, F172, F173 and F183 (supplied by Dainippon Ink & Chemicals, Inc.), Fluorad FC-135, FC-170C, FC-430 and FC-431 (supplied by Sumitomo 3M Co., Ltd.), Surflon S-112, S-113, S-131, S-141 and S-145 [supplied by Asahi Glass Co., Ltd.) and SH-28PA, SH-190, SH-193, SZ-6032 and SF-8428 (supplied by Toray Dow Corning Silicone). The amount of the surfactant per 100 parts by weight of the copolymer (A) or (A)' is preferably 5% by weight or less, more preferably 0.01 to 2% by weight.

Adhesive Aid

The thermosetting resin composition and radiation-sensitive resin composition of the present invention may contain an adhesive aid for improving the adhesion of each composition to a substrate. A functional silane coupling agent is effective as the adhesive aid. The functional silane coupling agent refers to a silane coupling agent having a reactive substituent such as a carboxyl group, a methacryloyl group, an isocyanate group or an epoxy group. Specific examples of the functional silane coupling agent include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycylcohexyl)ethyltrimethoxysilane. These adhesive aids may be used alone or in combination. The amount of the adhesive aid per 100 parts by weight of the copolymer (A) or (A)' is preferably 20 parts by weight or less, more preferably 10 parts by weight or less.

Method of Use of Thermosetting Resin Composition

Method of Forming Coating

When the thermosetting resin composition of the present invention is used, a coating can be formed by applying a solution of the thermosetting resin composition to a predetermined substrate surface and heating the composition. The method for the application to a substrate surface is not specially limited, and includes a spraying method, a roll coating method, a spin coating method, a screen printing method and an applicator method.

The composition of the present invention gives a coating excellent in heat resistance, transparency and hardness by heating it by means of a heating device such as a hot plate or an oven at a predetermined temperature, e.g., between 120° and 250° C., for a predetermined period of time, e.g., for 5 to 30 minutes on a hot plate or for 30 to 90 minutes in an oven.

Method of Use of Radiation-Sensitive Resin Composition

1. Method of forming coating

When the radiation-sensitive resin composition of the present invention is used, an intended coating can be formed by applying a solution of the radiation-sensitive resin composition to a predetermined substrate surface and removing the solvent by preliminary heating. The method of the application to a substrate is not specially limited, and includes a spin coating method, a roll coating method, a screen printing method and an applicator method.

The conditions for drying a coating of the composition of the present invention differs depending upon the kinds of components of the composition, the proportions of the components and the thickness of the coating, while the coating is generally dried at 70° to 90° C. for 1 to 10 minutes. When it is dried for too short a time, the state of adhesion intimacy is poor in development. When it is dried for too long a time, the resolution deteriorates due to heat exposure.

2. Method of exposure

The above-obtained coating is exposed to 200 to 500 nm ultraviolet light or visible light through a predetermined pattern mask, whereby a necessary portion alone can be photo-cured. The light source of these actinic radiations includes a low-pressure mercury lamp, a high-pressure mercury lamp, an ultrahigh-pressure mercury lamp, a metal halide lamp and an argon laser. Further, X-ray and electron beam can be used as active energy radiation.

The exposure dose differs depending upon the kinds of components of each composition, amounts thereof and the thickness of dried coating. When a high-pressure mercury lamp is used, the exposure dose is 500 mJ/cm$^2$ or less (by means of a 365 nm sensor).

3. Method of development

After the above exposure is carried out, there is employed a development method in which an alkaline aqueous solution is used as a developer solution and an unnecessary portion is dissolved and removed with the developer solution whereby a necessary portion alone is retained to form a pattern. Examples of the developer solution include aqueous solutions of alkalis such as sodium hydroxide, potassium hydroxide, sodium carbonate, sodium hydrogencarbonate, sodium silicate, sodium metasillcate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene and 1,5diazabicyclo[4,3,0]-5-nane. The developer solution may a mixture of an aqueous solution of any one of the above alkalis with a proper amount of a water-soluble organic solvent such as methanol or ethanol or a surfactant.

The development time differs depending upon the kinds of components of the composition, the proportions thereof and the thickness of a dried coating, while it is generally 30 to 180 seconds. The development method includes a dipping method, a puddling method and a spraying method. After the development, the coating is washed with flowing water for 30 to 90 seconds and air-dried with an air gun or dried in an oven to obtain an intended pattern.

4. Post-treatment

The composition of the present invention can be sufficiently cured by exposing it to the above actinic light or energy ray, while it may be further subjected to exposure (to be sometimes referred to "post-exposure" hereinafter) or heat-cured. The post-exposure or heat-curing is preferred particularly for obtaining a permanent coating. The post-exposure can be carried out by the same method as above, and the exposure dose is not specially limited. When a high-pressure mercury lamp is used, however, the exposure dose is preferably 1,000 mJ/cm$^2$ or less (by means of a 365 nm sensor). The heat-curing can be carried out by heating the coating by means of a heating device such as a hot plate or an oven at a predetermined temperature, e.g., between 120° and 250° C., for a predetermined period of time, e.g., for 10 to 60 minutes on a hot plate or for 30 to 90 minutes in an oven. As a result, there can be obtained a cured product having further excellent properties.

As explained above, it has been found by the present inventors that the excellent properties of an epoxy resin and an alkali-soluble resin can be retained together by means of copolymerization differing from conventional modification and mixing methods. As a result, it has been made possible to obtain a one-pack type thermosetting resin composition excellent in storage stability. Further, the copolymers are soluble in an alkali, and when mixed with a radiation-sensitive component, therefore, there can be obtained a radiation-sensitive resin composition which permits facile removal of an unnecessary portion by development. Furthermore, the composition can be imparted with properties such as chemical resistance, intimate adhesion and resistance to soldering as required by controlling the degree of heat crosslinkage thereof. The above composition can be suitably used as a coating composition, an electric insulating material, a printed circuit board, an adhesive, a civil construction material, toolings, a molding material and a protection film for which an epoxy resin has been conventionally used, and further, the above composition can be also used as a bump-forming resist, a wiring-forming resist, an electric plating resist, an electroless plating resist, a solder resist, an etching resist, an interlayer insulating film, a gate insulating film, a capacitor insulating film, a passivation film, an α-ray shielding film, and a buffer coating film which are required for production of a printed circuit board or for mounting semiconductors and electronic parts on a printed circuit board, where alkali-soluble resins are used; and as a color filter protection film for LCD and CCD whose optical properties are considered to be critical, a colored resist for a color filter and a surface protection film for an optical disk.

The composition of the present invention can be also used as a solder resist and an etching resist.

The present invention will be more specifically explained with reference to Examples. However, the present invention shall not be limited by these Examples. In Examples, "%" stands for "% by weight" unless otherwise specified.

SYNTHESIS EXAMPLE 1

A separable flask equipped with a stirrer, a cooling tube, a nitrogen introducing tube, a thermometer and a dry ice/methanol reflux device was charged with:

| | |
|---|---|
| dicyclopentanyl methacrylate | 57.0 g |
| methacrylic acid | 33.0 g |
| glycidyl methacrylate | 60.0 g |
| 2,2'-azobisisobutyronitrile | 6.0 g |
| and diethylene glycol dimethyl ether | 450.0 g. |

The separable flask was flushed with nitrogen for 30 minutes and, and then was immersed in an oil bath. While the mixture was stirred, the polymerization was carried out for 5 hours at the reaction temperature kept at 80° C. to give a resin solution having a solid content of 25.8% by weight, and the polymerization conversion was about 100%.

The above-obtained resin solution is referred to as "Resin solution 1" hereinafter.

SYNTHESIS EXAMPLE 2

The polymerization was carried out in the same manner as in Synthesis Example 1 except that the charged compounds were changed as follows, to give a resin solution having a solid content of 25.9% by weight. This resin solution is referred to as "Resin solution 2" hereinafter.

| | |
|---|---|
| sec-butyl methacrylate | 65.0 g |
| methacrylic acid | 20.0 g |

| | |
|---|---|
| glycidyl methacrylate | 65.0 g |
| 2,2'-azobis(2,4-dimethylvaleronitrile) | 6.0 g |
| and dioxane | 450.0 g |

SYNTHESIS EXAMPLE 3

The polymerization was carried out in the same manner as in Synthesis Example 1 except that the charged compounds were changed as follows, to give a resin solution having a solid content of 25.7% by weight. This resin solution is referred to as "Resin solution 3" hereinafter.

| | |
|---|---|
| styrene | 15.0 g |
| dicyclopentanyl methacrylate | 45.0 g |
| methacrylic acid | 30.0 g |
| glycidyl methacrylate | 60.0 g |
| 2,2'-azobis(2,4-dimethylvaleronitrile) | 6.0 g |
| and diethylene glycol dimethyl ether | 450.0 g |

SYNTHESIS EXAMPLE 4

The polymerization was carried out in the same manner as in Synthesis Example 1 except that the charged compounds were changed as follows, to give a resin solution having a solid content of 25.9% by weight. This resin solution is referred to as "Resin solution 4" hereinafter.

| | |
|---|---|
| methyl methacrylate | 37.5 g |
| methacrylic acid | 37.5 g |
| 3,4-epoxybutylglycidyl methacrylate | 75.0 g |
| 2,2'-azobisisobutyronitrile | 6.0 g |
| and diethylene glycol dimethyl ether | 450.0 g |

SYNTHESIS EXAMPLE 5

The polymerization was carried out in the same manner as in Synthesis Example except that the charged compounds were changed as follows, to give a resin solution having a solid content of 25.9% by weight. This resin solution is referred to as "Resin solution 5"hereinafter.

| | |
|---|---|
| benzyl methacrylate | 61.0 g |
| maleic anhydride | 40.0 g |
| 6,7-epoxyheptylglycidyl α-ethylacrylate | 49.0 g |
| 2,2'-azobis-2,4-dimethylvaleronitrile | 6.0 g |
| and dioxane | 450.0 g |

SYNTHESIS EXAMPLE 6

The polymerization was carried out in the same manner as in Synthesis Example 1 except that the charged compounds were changed as follows, to give a resin solution having a solid content of 25.9% by weight. This resin solution is referred to as "Resin solution 6" hereinafter.

| | |
|---|---|
| 1,3-butadiene | 4.5 g |
| styrene | 15.0 g |
| dicyclopentanyl methacrylate | 40.5 g |
| methacrylic acid | 30.0 g |
| glycidyl methacrylate | 60.0 g |
| 2,2'-azobisisobutyronitrile | 6.0 g |
| and diethylene glycol dimethyl ether | 450.0 g |

SYNTHESIS EXAMPLE 7

The polymerization was carried out in the same manner as in Synthesis Example 1 except that the charged compounds were changed as follows, to give a resin solution having a solid content of 25.6% by weight. This resin solution is referred to as "Resin solution 7" hereinafter.

| | |
|---|---|
| 1,3-butadiene | 15.0 g |
| styrene | 15.0 g |
| dicyclopentanyl methacrylate | 37.5 g |
| methacrylic acid | 22.5 g |
| glycidyl methacrylate | 60.0 g |
| 2,2'-azobisisobutyronitrile | 6.0 g |
| and diethylene glycol dimethyl ether | 450.0 g |

SYNTHESIS EXAMPLE 8

The polymerization was carried out in the same manner as in Synthesis Example 1 except that the charged compounds were changed as follows, to give a resin solution having a solid content of 25.8% by weight. This resin solution is referred to as "Resin solution 8" hereinafter.

| | |
|---|---|
| 1,3-butadiene | 10.0 g |
| styrene | 15.0 g |
| dicyclopentanyl methacrylate | 35.0 g |
| itaconic acid | 35.0 g |
| 6,7-epoxyheptylglycidyl α-ethylacrylate | 55.0 g |
| benzoyl peroxide | 6.0 g |
| and diethylene glycol monomethyl ether | 450.0 g |

SYNTHESIS EXAMPLE 9

The polymerization was carried out in the same manner as in Synthesis Example 1 except that the charged compounds were changed as follows, to give a resin solution having a solid content of 25.9% by weight. This resin solution is referred to as "Resin solution 9" hereinafter.

| | |
|---|---|
| 1,3-butadiene | 15.0 g |
| styrene | 15.0 g |
| dicyclopentanyl methacrylate | 37.5 g |
| maleic anhydride | 22.5 g |
| glycidyl methacrylate | 60.0 g |
| 2,2'-azobisisobutyronitrile | 6.0 g |
| and methyl 3-methoxypropionate | 450.0 g |

SYNTHESIS EXAMPLE 10

The polymerization was carried out in the same manner as in Synthesis Example 1 except that the charged compounds were changed as follows, to give a resin solution having a solid content of 25.9% by weight. This resin solution is referred to as "Resin solution 10" hereinafter.

| | |
|---|---|
| 1,3-butadiene | 15.0 g |
| p-methoxystyrene | 20.0 g |
| 2-methylcyclohexyl acrylate | 15.0 g |
| methacrylic acid | 35.0 g |

| | |
|---|---|
| 6,7-epoxyheptylglycidyl methacrylate | 65.0 g |
| 2,2'-azobisisobutyronitrile | 6.0 g |
| and diethylene glycol dimethyl ether | 450.0 g |

SYNTHESIS EXAMPLE 11

The polymerization was carried out in the same manner as in Synthesis Example 1 except that the charged compounds were changed as follows, to give a resin solution having a solid content of 25.9% by weight. This resin solution is referred to as "Resin solution 11" hereinafter.

| | |
|---|---|
| isoprene | 7.5 g |
| styrene | 22.5 g |
| methyl methacrylate | 12.5 g |
| itaconic acid | 27.5 g |
| glycidyl methacrylate | 80.0 g |
| benzoyl peroxide | 6.0 g |
| and diethylene glycol monomethyl ether | 450.0 g |

SYNTHESIS EXAMPLE 12

The polymerization was carried out in the same manner as in Synthesis Example 1 except that the charged compounds were changed as follows, to give a resin solution having a solid content of 25.7% by weight. This resin solution is referred to as "Resin solution 12" hereinafter.

| | |
|---|---|
| 1,3-butadiene | 20.0 g |
| styrene | 50.0 g |
| dicyclopentanyl methacrylate | 45.0 g |
| methacrylic acid | 35.0 g |
| 2,2'-azobisisobutyronitrile | 6.0 g |
| and diethylene glycol dimethyl ether | 450.0 g |

SYNTHESIS EXAMPLE 13

The polymerization was carried out in the same manner as in Synthesis Example 1 except that the charged compounds were changed as follows, to give a resin solution having a solid content of 25.9% by weight. This resin solution is referred to as "Resin solution 13" hereinafter.

| | |
|---|---|
| 1,3-butadiene | 15.0 g |
| styrene | 15.0 g |
| dicyclopentanyl methacrylate | 40.0 g |
| glycidyl methacrylate | 80.0 g |
| 2,2'-azobisisobutyronitrile | 6.0 g |
| and diethylene glycol dimethyl ether | 450.0 g |

EXAMPLE 1

(1) Preparation of Thermosetting Resin Composition

γ-Methacryloxypropyltrimethoxysilane in an amount of 10 parts by weight based on the resin content of Resin solution 1 obtained in Synthesis Example 1 ("part by weight" is used in this sense hereinafter in this Example) and 0.1 part by weight of SH-28PA were added to 100 g of Resin solution 1 obtained in Synthesis Example 1, and these components were mixed. The mixture was filtered with a 0.22 μm millipore filter to give a composition solution (1).

(2) Formation of Coating

The above composition solution (1) was applied to an $SiO_2$ glass substrate with a spinner, and applied composition solution was heat-treated on a hot plate at 180° C. for 30 minutes to give a coating having a thickness of 2.0 μm.

(3) Evaluation of Transparency

A coating was formed in the same manner as in the above (2) except that the $SiO_2$ glass substrate was replaced with a Corning 7059 (supplied by Corning).

The above-obtained coating was measured for a transmittance at 400 to 800 nm with a spectrophotometer (model 150-20, double beam, supplied by Hitachi Ltd.). The transparency was evaluated as follows. When the lowest transmittance was over 98%, a coating was rated as A. When it was 95 to 98%, a coating was rated as B. When it was less than 95%, a coating was rated as X. Table 1 shows the result.

(4) Evaluation of Heat Resistance

A substrate on which a coating had been formed in the same manner as in the above (2) was heated on a hot plate at 250° C. for 1 hour, and then the coating was measured for a thickness. Then, the film remaining ratio to the thickness of the coating before the heat treatment was calculated. The heat resistance was evaluated as follows. When the film remaining ratio was over 98%, a coating was rated as A. When it was 95 to 98%, a coating was rated as B. When it was less than 95%, a coating was rated as X. Table 1 shows the result.

(5) Evaluation of Resistance to Discoloration Under Heat

A substrate on which a coating had been formed in the same manner as in the above (2) was heated on a hot plate at 250° C. for 1 hour. Then, the coating was measured for a transmittance with a spectrophotometer in the same manner as in the above (3), and the change ratio to the transmittance of the coating before the heat treatment was calculated. The resistance to discoloration under heat was evaluated as follows. When the change ratio was less than 5%, a coating was rated as A. When it was 5 to 10%, a coating was rated as B. When it was over 10%, a coating was rated as X. Table 1 shows the result.

(6) Measurement of Hardness

The same coating as that prepared in the above (2) was measured for a hardness by a pencil scratch test according to JIS K-5400-1990, 8.4.1. The hardness was evaluated on the basis of scratch on the coating. Table 1 shows the result.

(7) Evaluation of Flattening

A coating was formed in the same manner as in the above (2) except that the $SiO_2$ glass substrate used in the above (1) was replaced with an $SiO_2$ wafer having a height difference on the surface by 1.0 μm. Then, the substrate was measured for a height difference on the surface with a tracer type film thickness measuring apparatus.

(8) Adhesion Test

A coating formed in the above (2) was subjected to a tape peel test according to JIS D-0202, and the adhesion was evaluated as follows. When the peel was less than 2%, a coating was rated as A. When it was 2 to 5%, a coating was rated as B. When it was over 5%, a coating was rated as X. Table 1 shows the result.

(9) Storage Stability

The composition solution (1) obtained in the above (1) was heated in a constant-temperature constant-humidity device at 40° C. for 200 hours, and measured for a viscosity change. The storage stability was evaluated as follows. When the viscosity change was less than 5%, a solution was rated as A. When it was 5 to 10%, a solution was rated as B. When it was over 10%, a solution was rated as X. Table 1 shows the result.

EXAMPLES 2-11

Composition solutions were prepared in the same manner as in Example 1 except that Resin solution 1 was replaced with Resin solutions 2 to 11 obtained in Synthesis Examples 2 to 11. The composition solutions were treated and evaluated in the same manner as in Example 1.

Table 1 shows the results.

TABLE 1

| Example | Hardness | Transparency | Heat resistance | Resistance to discoloration under heat | Flattening μm | Adhesion test | Storage stability |
|---|---|---|---|---|---|---|---|
| 1 | 6H | A | A | A | 0.2> | A | A |
| 2 | 5H | A | A | A | 0.2> | A | A |
| 3 | 5H | A | A | A | 0.3> | A | A |
| 4 | 5H | A | A | A | 0.3> | A | A |
| 5 | 5H | A | A | A | 0.2> | A | A |
| 6 | 4H | A | A | A | 0.1> | A | A |
| 7 | 4H | A | A | A | 0.1> | A | A |
| 8 | 6H | A | A | A | 0.1> | A | A |
| 9 | 6H | A | A | A | 0.1> | A | A |
| 10 | 4H | A | A | A | 0.1> | A | A |
| 11 | 5H | A | A | A | 0.1> | A | A |

COMPARATIVE EXAMPLES 1-2

Composition solutions were prepared in the same manner as in Example 1 except that Resin solution 1 was replaced with Resin solutions 12 and 13 obtained in Synthesis Examples 12 to 13. The composition solutions were treated and evaluated in the same manner as in Example 1.

Table 2 shows the results.

COMPARATIVE EXAMPLE 3

An attempt was made to prepare a composition solution in the same manner as in Example 1 except that Resin solution 1 obtained in Synthesis Example 1 was replaced with a resin solution prepared by mixing Resin solutions 12 and 13 obtained in Synthesis Examples 12 and 13 in a solid content mixing ratio of 2:1. However, Resin solutions 12 and 13 had too poor compatibility to form a uniform solution, and no further evaluations were possible.

COMPARATIVE EXAMPLE 4

An attempt was made to prepare a composition solution in the same manner as in Example 1 except that Resin solution 1 obtained in Synthesis Example 1 was replaced with a resin solution prepared by mixing Resin solutions 12 and 13 obtained in Synthesis Examples 12 and 13 in a solid content mixing ratio of 1:1. However, Resin solutions 12 and 13 had too poor compatibility to form a uniform solution, and no further evaluations were possible.

COMPARATIVE EXAMPLE 5

A composition solution was prepared in the same manner as in Example 1 except that Resin solution 1 obtained in Synthesis Example 1 was replaced with 25.0 g of EA-7130-1 (epoxy equivalent 655, acid value 80.5, supplied by Shinnakamura Chemical Industrial Co., Ltd.) obtained by carboxylating 50% acrylate of a cresol novolak type epoxy resin, and the composition solution was treated and evaluated in the same manner as in Example 1.

Table 2 shows the results.

COMPARATIVE EXAMPLE 6

A composition solution was prepared in the same manner as in Example 1 except that Resin solution 1 obtained in Synthesis Example 1 was replaced with 25.0 g of EA-6540 (acid value 80, supplied by Shinnakamura Chemical Industrial Co., Ltd.) obtained by carboxylating acrylate of a phenol novolak type epoxy resin, and the composition solution was treated and evaluated in the same manner as in Example 1.

Table 2 shows the results.

COMPARATIVE EXAMPLE 7

A composition solution was prepared in the same manner as in Example 1 except that Resin solution 1 obtained in Synthesis Example 1 was replaced with 25.0 g of EA-1040 (acid value 80, supplied by Shinnakamura Chemical Industrial Co., Ltd.) obtained by carboxylating acrylate of a bisphenol A type epoxy resin, and the composition solution was treated and evaluated in the same manner as in Example 1.

Table 2 shows the results.

COMPARATIVE EXAMPLE 8

A composition solution was prepared in the same manner as in Example 1 except that Resin solution 1 obtained in Synthesis Example 1 was replaced with 25 g of a cresol novolak type epoxy resin (Araldite ECN 1273, supplied by Ciba Geigy) and 2.5 g of DICY (dicyandiamide) as a curing agent component, and the composition solution was treated and evaluated in the same manner as in Example 1.

Table 2 shows the results.

COMPARATIVE EXAMPLE 9

A composition solution was prepared in the same manner as in Example 1 except that Resin solution 1 obtained in Synthesis Example 1 was replaced with 25 g of a cresol novolak type epoxy resin (Araldlte ECN 1273, supplied by Ciba Geigy) and 2.5 g of 2E4MZ-CN (2-Ethyl-4-methyl-3-cyanoethyl-imidazole) (supplied by Shikoku Chemicals Corporation) as a curing agent component, and the composition solution was treated and evaluated in the same manner as in Example 1.

Table 2 shows the results.

TABLE 2

| Comp. Example | Hardness | Transparency | Heat resistance | Resistance to discoloration under heat | Flattening μm | Adhesion test | Storage stability |
|---|---|---|---|---|---|---|---|
| 1 | 6H | A | X | X | 0.2> | B | A |
| 2 | H | A | X | X | 0.3< | A | A |

TABLE 2-continued

| Comp. Example | Hardness | Transparency | Heat resistance | Resistance to discoloration under heat | Flattening μm | Adhesion test | Storage stability |
|---|---|---|---|---|---|---|---|
| 3 | No uniform solution was formed and evaluation was impossible. | | | | | | |
| 4 | No uniform solution was formed and evaluation was impossible. | | | | | | |
| 5 | H | B | B | X | 0.5< | A | B |
| 6 | H | B | B | X | 0.5< | A | B |
| 7 | H | X | X | B | 0.3< | A | B |
| 8 | 3H | A | A | B | 0.5< | B | X |
| 9 | 3H | A | A | X | 0.5< | A | X |

EXAMPLE 12

(1) Preparation of Radiation-Sensitive Resin Composition

Aronix M-400 (supplied by Toagosei Chemical Industry Co., Inc.) in an amount of 120 parts by weight based on the resin content of Resin solution 1 obtained in Synthesis Example 1 ("part by weight" is used in this sense hereinafter in this Example), 20 parts by weight of 2-benzyl-2-dimethylamino-1-(4-morpholinophenyl)-butan-1-one, 10 parts by weight of γ-methacryloxypropyltrimethoxysilane and 0.1 part by weight of SH-28PA were added to 100 g of Resin solution obtained in Synthesis Example 1, and these components were mixed. The mixture was filtered with a 0.22 μm millipore filter to give a composition solution (2).

(2) Formation of Coating

The above composition solution (2) was applied to an $SiO_2$ glass substrate with a spinner, and applied composition solution was pre-baked on a hot plate at 80° C. for 5 minutes to give a coating having a thickness of 2.0 μm.

(3) Evaluation of Resist Properties

The resist film obtained in the above (2) was exposed to light from a high-pressure mercury lamp (USH-250D, supplied by Ushio Inc.) at 200 mJ/cm² (by means of 365 nm sensor) through a resolution-measuring negative mask (TOPPAN-TEST-CHART-N) in oxygen atmosphere (in air). Then, the resist film was developed with an aqueous solution of tetramethylammonium hydroxide at 25° C. for 1 minute, rinsed with ultrapure water for 1 minute and subjected to nitrogen blowing to a remaining pattern. The pattern was observed through an optical microscope to measure a resolution. Further, after the development, the film thickness was measured (with α-step 100 supplied by HERZ) to determine a film remaining ratio (%). The film remaining ratio refers to a value obtained by dividing the thickness of the developed film by the thickness of the pre-baked film and multiplying the quotient by 100. The resist properties were evaluated as follows. When the film remaining ratio was over 90%, a coating was rated as A. When it was 90 to 80%, a coating was evaluated as B. When it was less than 80%, a coating was evaluated as X.

Table 3 shows the developer concentration (at which a non-exposed portion was removable), the resolution and the film remaining ratio.

(4) Curing of Coating

The coating obtained in the above (3) was cured by heating it on a hot plate at 200° C. for 20 minutes.

(5) Evaluation of Transparency

A coating was formed in the same manner as in the above (2) except that the $SiO_2$ glass substrate was replaced with a Corning 7059 (supplied by Corning).

The above-obtained coating was measured for a transmittance at 400 to 800 nm with a spectrophotometer (model 150-20, double beam, supplied by Hitachi Ltd.). The transparency was evaluated as follows. When the lowest transmittance was over 98%, a coating was rated as A. When it was 95 to 98%, a coating was rated as B. When it was less than 95%, a coating was rated as X. Table 3 shows the result.

(6) Evaluation of Heat Resistance

A substrate on which a coating had been formed in the same manner as in the above (2) was heated on a hot plate at 250° C. for 1 hour, and then the coating was measured for a thickness. Then, the film remaining ratio to the thickness of the coating before the heat treatment was calculated. The heat resistance was evaluated as follows. When the film remaining ratio was over 98%, a coating was rated as A. When it was 95 to 98%, a coating was rated as B. When it was less than 95%, a coating was rated as X. Table 3 shows the result.

(7) Evaluation of Resistance to Discoloration Under Heat

A substrate on which a coating had been formed in the same manner as in the above (2) was heated on a hot plate at 250° C. for 1 hour. Then, the coating was measured for a transmittance with a spectrophotometer in the same manner as in the above (3), and the change ratio to the transmittance of the coating before the heat treatment was calculated. The resistance to discoloration under heat was evaluated as follows. When the change ratio was less than 5%, a coating was rated as A. When it was 5 to 10%, a coating was rated as B. When it was over 10%, a coating was rated as X. Table 3 shows the result.

(8) Measurement of Hardness

The same coating as that prepared in the above (5) was measured for a hardness by a pencil scratch test according to JIS K-5400-1990, 8.4.1. The hardness was evaluated on the basis of scratch on the coating. Table 3 shows the result.

(9) Evaluation of Flattening

A coating was formed in the same manner as in the above (2)–(4) except that the $SiO_2$ glass substrate was replaced with an $SiO_2$ wafer having a height difference on the surface by 1.0 μm. Then, the substrate was measured for a height difference on the surface with a tracer type film thickness measuring apparatus. Table 3 shows the result.

(10) Storage Stability

The composition solution (2) obtained in the above (1) was heated in a constant-temperature constant-humidity device at 40° C. for 200 hours, and measured for a viscosity change. The storage stability was evaluated as follows. When the viscosity change was less than 5%, a solution was rated as A. When it was 5 to 10%, a solution was rated as B. When it was over 10%, a solution was rated as X. Table 3 shows the result.

EXAMPLES 13-22

Composition solutions were prepared in the same manner as in Example 12 except that Resin solution 1 obtained in Synthesis Example 1 was replaced with Resin solutions obtained in Synthesis Examples 2 to 11. The composition solutions were treated and evaluated in the same manner as in Example 12.

Table 3 shows the results.

EXAMPLE 27

A composition solution was prepared in the same manner as in Example 12 except that the Aronix M-400 (supplied by Toagosei Chemical Industry Co., Inc.) was replaced with KAYARAD TMPTA (supplied by Nippon Kayaku Co., Ltd.). The composition solution was treated and evaluated in the same manner as in Example 12. Table 3 shows the results.

TABLE 3

| Example | Concentration of developer solution wt % | Resolution μm | Film remaining ratio | Hardness | Transparency | Heat resistance | Resistance to discoloration under heat | Flattenting μm | Adhesion test | Storage stability |
| --- | --- | --- | --- | --- | --- | --- | --- | --- | --- | --- |
| 12 | 0.14 | 14 | A | 5H | A | A | A | 0.2> | A | A |
| 13 | 1.5 | 12 | A | 4H | A | A | A | 0.2> | A | A |
| 14 | 0.20 | 10 | A | 5H | A | A | A | 0.3> | A | A |
| 15 | 0.14 | 16 | A | 4H | A | A | A | 0.3> | A | A |
| 16 | 1.0 | 16 | A | 4H | A | A | A | 0.2> | A | A |
| 17 | 0.20 | 6.0 | A | 3H | A | A | A | 0.1> | A | A |
| 18 | 1.6 | 2.0 | A | 4H | A | A | A | 0.1> | A | A |
| 19 | 0.8 | 4.0 | A | 5H | A | A | A | 0.1> | A | A |
| 20 | 0.5 | 1.8 | A | 6H | A | A | A | 0.1> | A | A |
| 21 | 0.14 | 2.0 | A | 4H | A | A | A | 0.1> | A | A |
| 22 | 0.4 | 4.2 | A | 5H | A | A | A | 0.1> | A | A |
| 23 | 0.16 | 10 | A | 4H | A | A | A | 0.1> | A | A |
| 24 | 0.14 | 12 | A | 4H | A | A | A | 0.1> | A | A |
| 25 | 0.20 | 10 | A | 3H | A | A | A | 0.1> | A | A |
| 26 | 0.16 | 14 | A | 4H | A | A | A | 0.1> | A | A |
| 27 | 1.20 | 12 | A | 4H | A | A | A | 0.1> | A | A |

EXAMPLE 23

A composition solution was prepared in the same manner as in Example 12 except that the 2-benzyl-2-dimethylamino-1-(4-morpholinophenyl)-butan-1-one was replaced with 2,4,6-trlmethylbenzoyldiphenylphosphine oxide. The composition solution was treated and evaluated in the same manner as in Example 12. Table 3 shows the results.

EXAMPLE 24

A composition solution was prepared in the same manner as in Example 12 except that the 2-benzyl-2-dimethylamino-1-(4-morpholinophenyl)-butan-1-one was replaced with 2-methyl-[4-(methylthio)phenyl]-2-morpholino-1-propane. The composition solution was treated and evaluated in the same manner as in Example 12. Table 3 shows the results.

EXAMPLE 25

A composition solution was prepared in the same manner as in Example 12 except that the Aronix M-400 (supplied by Toagosei Chemical Industry Co., Inc.) was replaced with Aronix M-8060 (supplied by Toagosei Chemical Industry Co., Inc.). The composition solution was treated and evaluated in the same manner as in Example 12. Table 3 shows the results.

EXAMPLE 26

A composition solution was prepared in the same manner as in Example 12 except that the Aronix M-400 (supplied by Toagosei Chemical Industry Co., Inc.) was replaced with Aronix M-210 (supplied by Toagosei Chemical Industry Co., Inc.). The composition solution was treated and evaluated in the same manner as in Example 12. Table 3 shows the results.

COMPARATIVE EXAMPLE 10

A composition solution was prepared in the same manner as in Example 12 except that Resin solution 1 obtained in Synthesis Example 1 was replaced with 25.0 g of EA-7130-1 (epoxy equivalent 655, acid value 80.5, supplied by Shinnakamura Chemical Industrial Co., Ltd.) obtained by carboxylating 50% acrylate of a cresol novolak type epoxy resin, and the composition solution was treated and evaluated in the same manner as in Example 12.

Table 4 shows the results.

COMPARATIVE EXAMPLE 11

A composition solution was prepared in the same manner as in Example 11 except that Resin solution 1 obtained in Synthesis Example 1 was replaced with 25.0 g of EA-6540 (acid value 80, supplied by Shinnakamura Chemical Industrial Co., Ltd.) obtained by carboxylating acrylate of a phenol novolak type epoxy resin, and the composition solution was treated and evaluated in the same manner as in Example 12.

Table 4 shows the results.

COMPARATIVE EXAMPLE 12

A composition solution was prepared in the same manner as in Example 12 except that Resin solution 1 obtained in Synthesis Example 1 was replaced with 25.0 g of EA-1040 (acid value 80, supplied by Shinnakamura Chemical Industrial Co., Ltd.) obtained by carboxylating acrylate of a bisphenol A type epoxy resin, and the composition solution was treated and evaluated in the same manner as in Example 12.

Table 2 shows the results.

COMPARATIVE EXAMPLE 13

A composition solution was prepared in the same manner as in Example 12 except that Resin solution 1 obtained in Synthesis Example 1 was replaced with 25 g of a cresol novolak type epoxy resin (Araldite ECN 1273, supplied by Ciba Geigy) and 2.5 g of DICY (dicyandiamide) as a curing agent component, and the composition solution was treated and evaluated in the same manner as in Example 12.

Table 4 shows the results.

COMPARATIVE EXAMPLE 14

A composition solution was prepared in the same manner as in Example 12 except that Resin solution 1 obtained in Synthesis Example 1 was replaced with 25 g of a cresol novolak type epoxy resin (Araldite ECN 1273, supplied by Ciba Geigy) and 2.5 g of 2E4MZ-CN (supplied by Shikoku Chemicals Corporation) as a curing agent component, and the composition solution was treated and evaluated in the same manner as in Example 12.

Table 4 shows the results.

TABLE 4

| Comp. Example | Concentration of developer solution wt % | Resolution μm | Film remaining ratio | Hardness | Transparency | Heat resistance | Resistance to discoloration under heat | Flattening μm | Adhesion test | Storage stability |
|---|---|---|---|---|---|---|---|---|---|---|
| 10 | 1.6 | 30 | B | 2H | X | B | X | 0.6< | A | B |
| 11 | 1.4 | 34 | B | H | B | B | X | 0.6< | A | B |
| 12 | 1.5 | 40 | X | 2H | B | B | B | 0.5< | A | X |
| 13 | Development impossible | — | — | — | — | — | — | — | — | — |
| 14 | Development impossible | — | — | — | — | — | — | — | — | — |

What is claimed is:

1. An epoxy group-containing thermosetting resin composition comprising:
    (A) a copolymer obtained from the following unsaturated monomers (a), (b) and (c):
    (a) 5-40% by weight of at least one member selected from the group consisting of an unsaturated carboxylic acid and an unsaturated carboxylic acid anhydride,
    (b) 10-70% by weight of an epoxy group-containing unsaturated compound, and
    (c) 10-70% by weight of a monoolefin unsaturated compound selected from the group consisting of an alkyl ester, hydroxyalkyl ester, cycloalkyl ester or aryl ester of an aliphatic unsaturated carboxylic acid, a dialkyl ester of an aliphatic unsaturated dicarboxylic acid, and other vinyl compounds,
    (B) an organic solvent for dissolving the above copolymer, and
    (C) a silane coupling agent.

2. The composition of claim 1, wherein the unsaturated carboxylic acid and the unsaturated carboxylic acid anhydride are selected from aliphatic mono- and dicarboxylic acids having 3 to 5 carbon atoms, anhydrides thereof and half esters of aliphatic dicarboxylic acids.

3. The composition of claim 1, wherein the epoxy group-containing unsaturated compound is an epoxy alkyl ester of acrylic acid or α-alkylacrylic acid, and N-epoxyalkyl acrylamide or α-alkylacrylamide.

4. The composition of claim 1, wherein the copolymer is contained in an amount of 3 to 50 parts by weight when the total amount of the copolymer and the organic solvent is 100 parts by weight.

5. The composition as claimed in claim 1, wherein said unsaturated carboxylic acid has the formula:

and the unsaturated carboxylic acid anhydride has the formula:

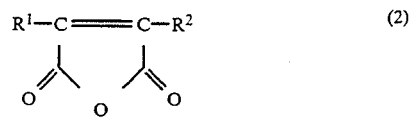

wherein $R^1$ and $R^2$ in both of the above formulae independently represent a hydrogen atom or a $C_1$-$C_6$ alkyl group.

6. The composition as claimed in claim 5, wherein said epoxy group-containing unsaturated compound has the formula:

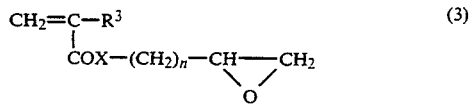

wherein $R^3$ is hydrogen or a $C_1$-$C_4$ alkyl group, n is an integer of from 1 to 10, and X is —O— or a group having the formula:

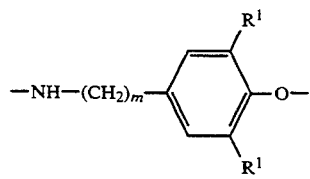

wherein $R^1$ is a $C_1$-$C_6$ alkyl group and m is an integer of from 1 to 10.

7. The composition as claimed in claim 6, wherein said monoolefin unsaturated compound has the formula:

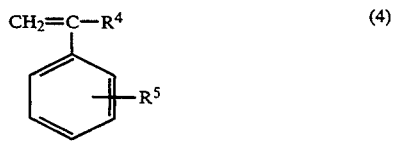

wherein R⁴ is a hydrogen atom or a $C_1$-$C_4$ alkyl group and R⁵ is a hydrogen atom, a $C_1$-$C_4$ alkyl group or a $C_1$-$C_4$ alkoxy group, or has the formula:

 (5)

wherein each of R⁶ and R⁷ is independently a hydrogen atom or a methyl group and wherein R⁸ is a $C_1$-$C_6$ alkyl group or a $C_5$-$C_{12}$ cycloalkyl group.

8. The composition as claimed in claim 7, wherein said silane coupling agent is selected from the group consisting of trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycyclohexyl)ethyltrimethoxysilane.

9. The composition as claimed in claim 8, wherein said silane coupling agent is present in said composition, and in an amount of 20 parts by weight or less.

10. The composition as claimed in claim 1, wherein said silane coupling agent is selected from the group consisting of trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycyclohexyl)ethyltrimethoxysilane.

11. The composition as claimed in claim 10, wherein said component (A) is selected from the group consisting of acrylic acid, methacrylic acid, crotonic acid, maleic acid, fumaric acid, citraconic acid, mesaconic acid, itaconic acid, maleic anhydride, itaconic anhydride, monomethyl fumarate, monobutyl fumarate, monomethyl maleate, monoethyl maleate, monobutyl maleate, monomethyl itaconate, monoethyl itaconate and monobutyl itaconate, wherein said component (B) is selected from the group consisting of glycidyl acrylate, glycidyl methacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, N-(4-(2,3-epoxypropoxy)-3,5-dimethylbenzyl)acrylamide and N-(4-(2,3-epoxypropoxy)-3,5-dimethylphenylpropyl)acrylamide, and wherein said component (C) is selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentanyl methacrylate, dicyclopentanyloxyethyl methacrylate, isobornyl methacrylate, cyclohexyl acrylate, 2-methylcyclohexyl acrylate, dicyclopentanyl acrylate, dicyclopentanyloxyethyl acrylate, isobornyl acrylate, phenyl methacrylate, benzyl methacrylate, phenyl acrylate, benzyl acrylate, diethyl maleate, diethyl fumarate, diethyl itaconate, 2-hydroxyethyl methacrylate, 2-hydroxypropyl methacrylate, styrene, α-methylstyrene, m-methylstyrene, p-methylstyrene, vinyltoluene, p-methoxystyrene and p-tert-butoxystyrene.

* * * * *